(12) United States Patent
Anazawa

(10) Patent No.: US 7,617,463 B2
(45) Date of Patent: Nov. 10, 2009

(54) POWER SUPPLY METHOD FOR SEMICONDUCTOR INTEGRATED CIRCUIT IN TEST AND CAD SYSTEM FOR SEMICONDUCTOR INTEGRATED CIRCUIT

(75) Inventor: Tetsuya Anazawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 114 days.

(21) Appl. No.: 11/494,510

(22) Filed: Jul. 28, 2006

(65) Prior Publication Data

US 2007/0229110 A1    Oct. 4, 2007

(30) Foreign Application Priority Data

Mar. 28, 2006    (JP) .............................. 2006-087549

(51) Int. Cl.
*G06F 17/50*    (2006.01)
(52) U.S. Cl. .................. 716/4; 716/5; 716/12; 324/500
(58) Field of Classification Search .............. 716/8–11, 716/4–6, 19–21, 12–14; 324/500
See application file for complete search history.

(56) References Cited

U.S. PATENT DOCUMENTS

| | | | |
|---|---|---|---|
| 6,253,354 B1 * | 6/2001 | Kuwano et al. ................ | 716/4 |
| 6,584,606 B1 * | 6/2003 | Chiu et al. ..................... | 716/10 |
| 6,868,374 B1 * | 3/2005 | Ditlow et al. .................. | 703/18 |
| 6,957,413 B1 * | 10/2005 | McKeone et al. .............. | 716/18 |
| 2006/0095881 A1 * | 5/2006 | Kwon et al. ................... | 716/10 |
| 2006/0239102 A1 * | 10/2006 | Saita et al. .................... | 365/226 |

FOREIGN PATENT DOCUMENTS

JP    2004-234618    8/2004

OTHER PUBLICATIONS

"Optimal placement of power-supply pads and pins" by Min Zhao, Yuhong Fu, Vladimir Zolotov, IEEE on Computer-aided design of integrated circuit and system, vol. 25, Jan. 2006.*
"A Fast algorithm for power grid design", by Jaskirat Singh and Sachin S. Sapatnekar, @ 2005 ACM.*

* cited by examiner

*Primary Examiner*—Paul Dinh
*Assistant Examiner*—Nha T Nguyen
(74) *Attorney, Agent, or Firm*—Westerman, Hattori, Daniels & Adrian, LLP

(57) ABSTRACT

In a power supply port decision step, first, a required minimum number of power supply ports for use in a test is found based on power consumption information and the required minimum number of power bumps out of plural power bumps are decided as the power supply ports for use in the test. Then, processing is repeatedly performed until neither a voltage drop violation nor a current density violation is detected by a power mesh analysis. The processing consists of additionally deciding, as the power supply port for use in the test, a power bump corresponding to a place where the voltage drop violation occurs when the violation is detected by the power mesh analysis, and of modifying a layout of a place where the current density violation occurs when the violation is detected by the power mesh analysis.

8 Claims, 5 Drawing Sheets

Prior Art

POWER SUPPLY METHOD FOR SEMICONDUCTOR INTEGRATED CIRCUIT IN TEST AND CAD SYSTEM FOR SEMICONDUCTOR INTEGRATED CIRCUIT

CROSS REFERENCE TO RELATED APPLICATION

This application is based upon and claims the benefit of priority from Japanese Patent Application No. 2006-087549, filed on Mar. 28, 2006, the entire contents of which are incorporated herein by reference.

BACKGROUND OF THE INVENTION

1. Field of the Invention

The present invention relates to a technique for testing a semiconductor integrated circuit having a flip chip structure.

2. Description of the Related Art

A flip chip is a chip in which terminals called bumps are arranged at regular intervals over the entire chip, and its name is derived from the fact that the chip is flipped when being packed into a package. There are two main types of methods for testing a wafer of such a flip chip (a semiconductor integrated circuit having a flip chip structure).

FIGS. 1A and 1B show conventional wafer test methods for the flip chip. As shown in FIG. 1A, a first test method is a method for performing a test while bringing test terminals PP of a pad contact test jig into contact with test pads PD arranged along an outer periphery of the chip instead of bumps BMP arranged at regular intervals over the entire chip.

As shown in FIG. 1B, a second test method is a method for performing a test while bringing test terminals PB of a bump contact test jig into contact with all of the bumps BMP arranged at regular intervals over the entire chip. Incidentally, in FIG. 1A and FIG. 1B, the shaded bumps BMP are power bumps, and the non-shaded bumps BMP are signal bumps.

Moreover, Japanese Unexamined Patent Application Publication No. 2004-234618 discloses a technique for performing a power noise analysis of a semiconductor device with high accuracy.

In the first test method, although the test cost is low, due to the arrangements of the test pads on the periphery, a voltage drop may occur in the vicinity of the center of the chip if the power consumption of the semiconductor integrated circuit is high, which makes the test unfeasible at worst.

In the second test method, there is no possibility that the voltage drop causes the test to be unfeasible since all of the power bumps are used as power supply ports. However, the second test method has a problem that a dedicated test jig (bump contact test jig) is needed to bring the test terminals into direct contact with the bumps. Furthermore, the number of test terminals increases in proportion to the number of bumps, thereby increasing the test cost. Not to mention, the larger the chip size is, the larger the number of bumps becomes, so that the test cost becomes very high if the chip size is large.

SUMMARY OF THE INVENTION

An object of the present invention is to provide a technique for certainly performing a test of a semiconductor integrated circuit having a flip chip structure at low cost.

In one aspect of the present invention, a power supply port decision step is performed by a CAD system for a semiconductor integrated circuit having a flip chip structure. In the power supply port decision step for the semiconductor integrated circuit, part of plural power bumps are decided as power supply ports for use in the test such that a number of the power supply ports is within such a range that neither a voltage drop violation nor a current density violation is detected by a power mesh analysis.

For example, in the power supply port decision step, first, a required minimum number of the power supply ports for use in the test is found based on power consumption information and the required minimum number of power bumps out of the plural power bumps are decided as the power supply ports for use in the test. Alternatively, processing of deciding a first one in every predetermined number of power bumps out of the plural power bumps as the power supply ports for use in the test while increasing the predetermined number sequentially, is performed repeatedly until the voltage drop violation is detected by the power mesh analysis. Then, processing is repeatedly performed until neither the voltage drop violation nor the current density violation is detected by the power mesh analysis. The processing consists of additionally deciding, as the power supply port for use in the test, a power bump corresponding to a place where the voltage drop violation occurs when the violation is detected by the power mesh analysis, and of modifying a layout of a place where the current density violation occurs when the violation is detected by the power mesh analysis.

The test is performed while bringing power supply test terminals of a test jig into contact only with the power bumps which are decided as the power supply ports for use in the test in the power supply port decision step. This eliminates the possibility that the test to be unfeasible due to a voltage drop, moreover, it can reduce the number of the power supply test terminals of the test jig. Thus, it is possible to certainly perform the test of the semiconductor integrated circuit having the flip chip structure at low cost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 2A:
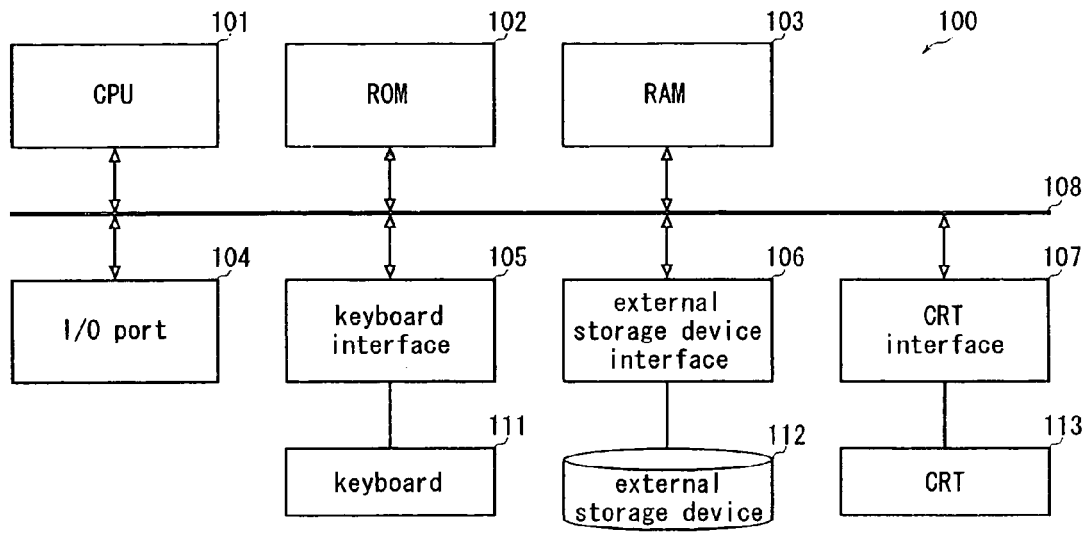
FIG. 2A and FIG. 2B are block diagrams showing an overall configuration of a CAD system for a semiconductor integrated circuit which embodies the present invention.
Figure 2B:
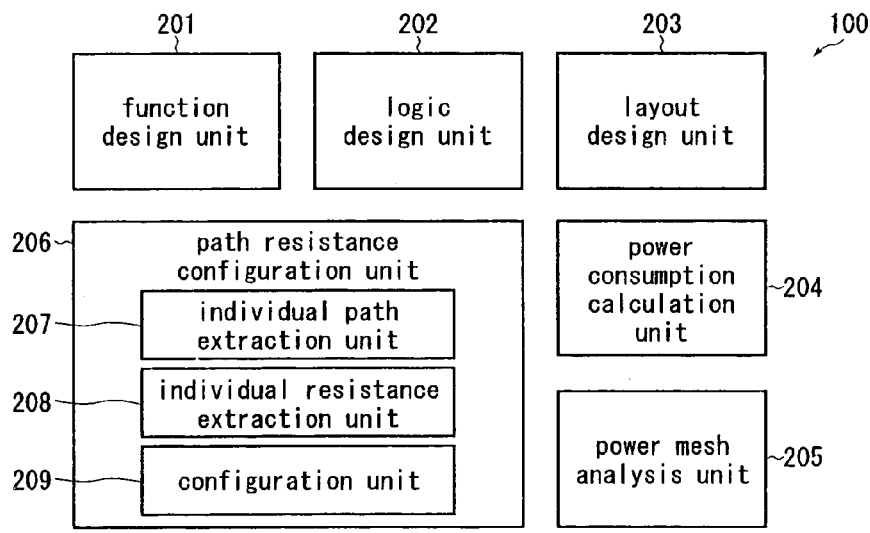

Embodiments of the present invention will be described below using the drawings. FIG. 2A to FIG. 4 show a first embodiment of the present invention. FIG. 2A and FIG. 2B show an overall configuration of a CAD system for a semiconductor integrated circuit which embodies the present invention. As shown in FIG. 2A, a hardware configuration of a CAD system 100 is the same as that of a commonly used personal computer, workstation, or the like, and includes a CPU 101, a ROM 102, a RAM 103, an I/O port 104, a keyboard interface 105, an external storage device interface 106, a CRT interface 107, a bus 108, a keyboard 111, an external storage device 112, and a CRT 113. Such a hardware configuration is widely known, so that the detailed description thereof is omitted here.

As shown in FIG. 2B, a functional block configuration of the CAD system 100 includes a function design unit 201 for generating an RTL description, a logic design unit 202 for generating a net list, a layout design unit 203 for generating layout data, a power consumption calculation unit 204 for calculating a power consumption of the semiconductor integrated circuit, a power mesh analysis unit 205 for performing a power mesh analysis, and a path resistance configuration unit 206 for creating models for the power mesh analysis. These functional blocks are embodied by software. Note that the CAD system 100 includes various functional blocks other than these functional blocks, but the description thereof is omitted here since they do not directly relate to the present invention.

The path resistance configuration unit 206 includes an individual path extraction unit 207, an individual resistance extraction unit 208, and a configuration unit 209. The individual path extraction unit 207 extracts and stores wiring paths on the chip. The individual resistance extraction unit 208 extracts and stores resistances in the wiring paths stored by the individual path extraction unit 207. The configuration unit 209 models resistances and wiring structures of all the wiring paths based on the resistances stored by the individual resistance extraction unit 208. Models created by the configuration unit 209 are used for the power mesh analysis by the power mesh analysis unit 205. Incidentally, the power mesh analysis by the power mesh analysis unit 205 and the creation of the models by the path resistance configuration unit 206 (the individual path extraction unit 207, the individual resistance extraction unit 208, and the configuration unit 209) are known techniques, so that the detailed description thereof is omitted here.

Figure 3:
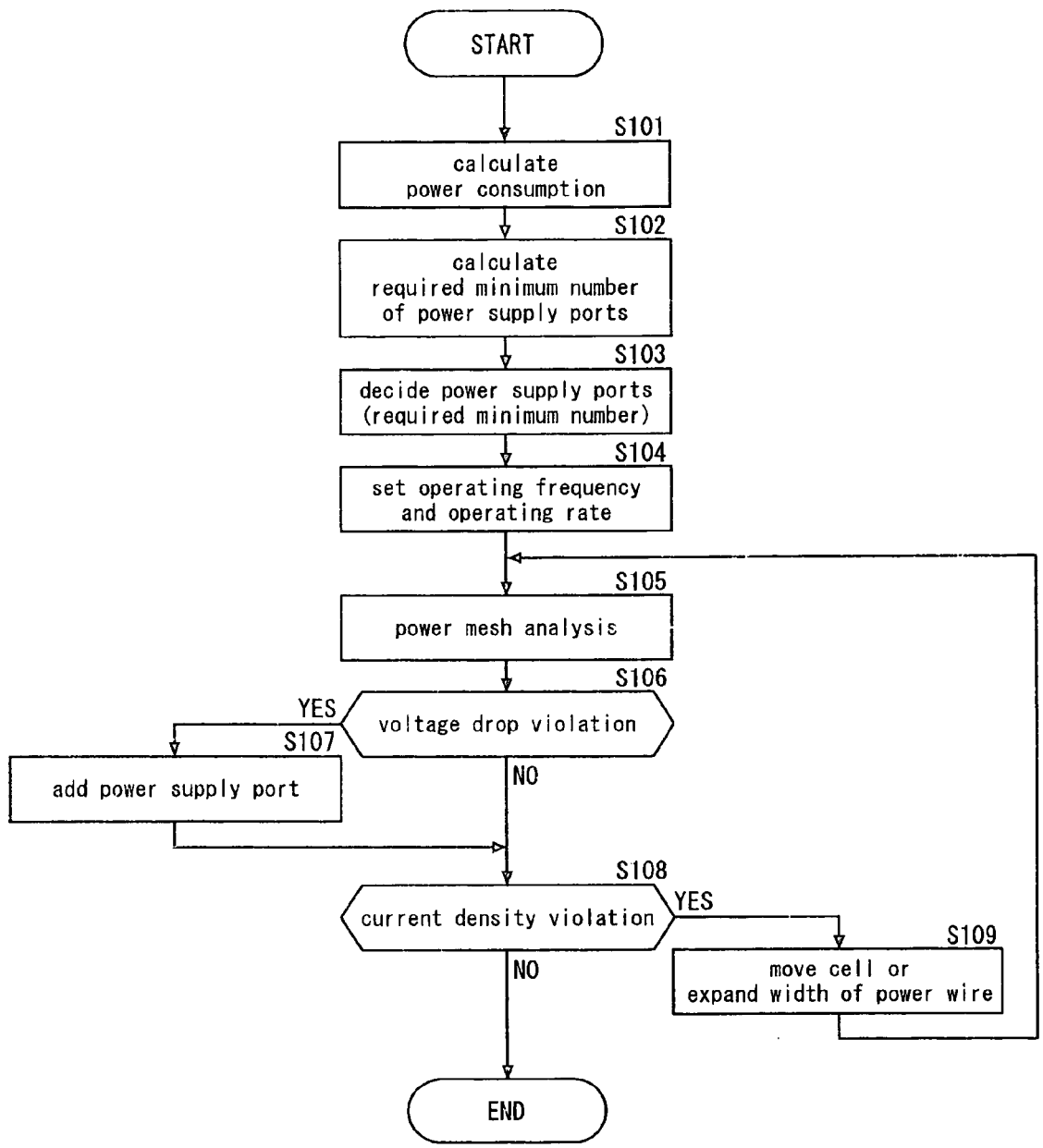
FIG. 3 is a flowchart showing power supply port decision processing in a first embodiment.

FIG. 3 shows power supply port decision processing in the first embodiment. In the first embodiment, the CAD system 100 (the CPU 101) decides power supply ports for use in a test (power bumps with which power supply test terminals of a test jig are brought into contact in a wafer test) with respect to a semiconductor integrated circuit having a flip chip structure by appropriately performing steps S101 to S109 shown below.

In step S101, the CAD system 100 calculates a power consumption of the semiconductor integrated circuit using a test pattern by the power consumption calculation unit 204. Incidentally, when the power consumption of the semiconductor integrated circuit is calculated, it is desirable to use a test pattern in which the power consumption of the semiconductor integrated circuit becomes maximum out of plural test patterns used in the wafer test in order to accurately calculate a required minimum number of the power supply ports for use in the test in step S102 described later. Note, however, that when it is difficult to calculate the power consumption if the test pattern in which the power consumption of the semiconductor integrated circuit becomes maximum, a power consumption of the semiconductor integrated circuit during actual device operation may be used as a substitute therefor. After this, the power supply port decision processing proceeds to step S102.

In step S102, the CAD system 100 calculates the required minimum number of the power supply ports for use in the test by dividing the power consumption calculated in step S101 by a power voltage value and an allowable current value for each power bump. After this, the power supply port decision processing proceeds to step S103.

In step S103, the CAD system 100 decides the required minimum number of power bumps out of plural power bumps at intervals as regular as possible as the power supply ports for use in the test to prevent the occurrence of a voltage drop. After this, the power supply port decision processing proceeds to step S104.

In step S104, the CAD system 100 sets an operating frequency and an operating rate when the power consumption is calculated in step S101. The operating rate here means the probability of occurrence of events (a rising transition and a falling transition) within a certain period of time in various signals. After this, the power supply port decision processing proceeds to step S105.

In step S105, the CAD system 100 performs a power mesh analysis at the operating frequency and the operating rate set in step S104 by the power mesh analysis unit 205. After this, the power supply port decision processing proceeds to step S106.

In step S106, the CAD system 100 determines whether or not a voltage drop violation is detected by the power mesh analysis performed in step S105. If it is determined that the voltage drop violation is detected by the power mesh analysis, the power supply port decision processing proceeds to step S107. If it is determined that the voltage drop violation is not detected by the power mesh analysis, the power supply port decision processing proceeds to step S108.

In step S107, the CAD system 100 adds a power bump in the vicinity of a place where the voltage drop violation occurs as the power supply port for use in the test. After this, the power supply port decision processing proceeds to step S108.

In step S108, the CAD system 100 determines whether or not a current density violation is detected by the power mesh analysis performed in step S105. If it is determined that the current density violation is detected by the power mesh analysis, the power supply port decision processing proceeds to step S109. If it is determined that the current density violation is not detected by the power mesh analysis, the power supply port decision processing is completed.

In step S109, the CAD system 100 moves a cell in a place where the current density violation occurs to connect it to a thick power wire or expands the width of a power wire in the place where the current density violation occurs by the layout design unit 203. After this, the power supply port decision processing proceeds to step S105. Accordingly, steps S105 to S109 are repeatedly performed until neither the voltage drop violation nor the current density violation is detected by the power mesh analysis performed in step S105.

Figure 1A:
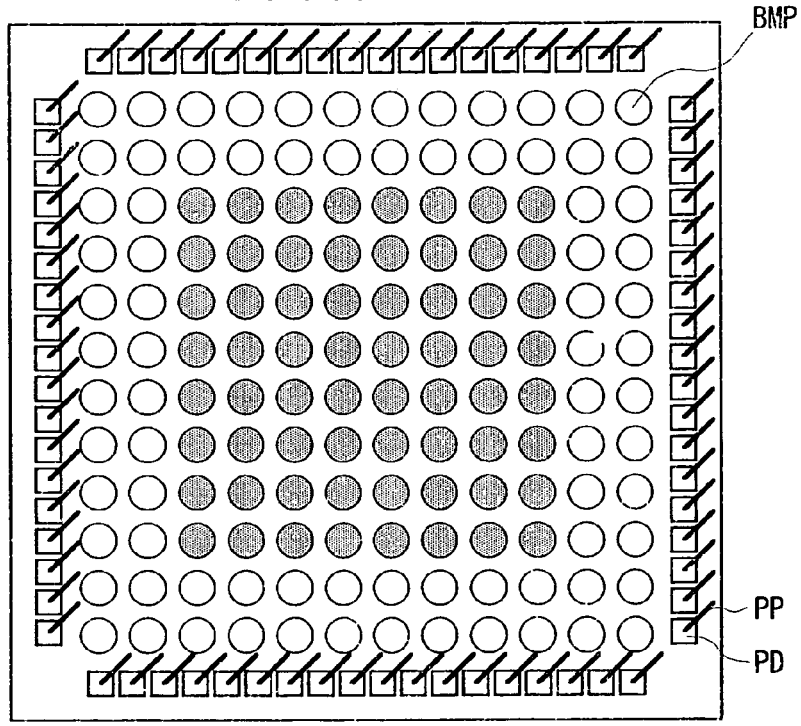
FIG. 1A and FIG. 1B are explanatory views showing conventional wafer test methods in a flip chip.
Figure 1B:
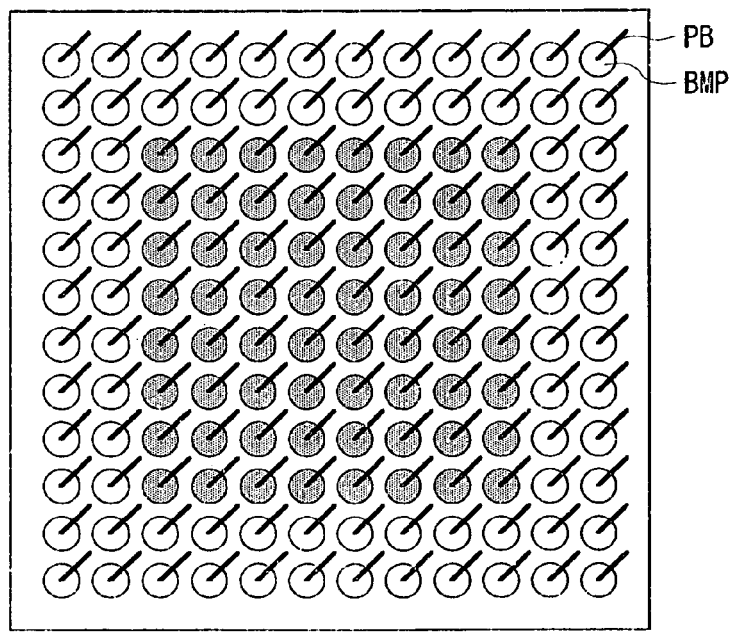
Figure 4:
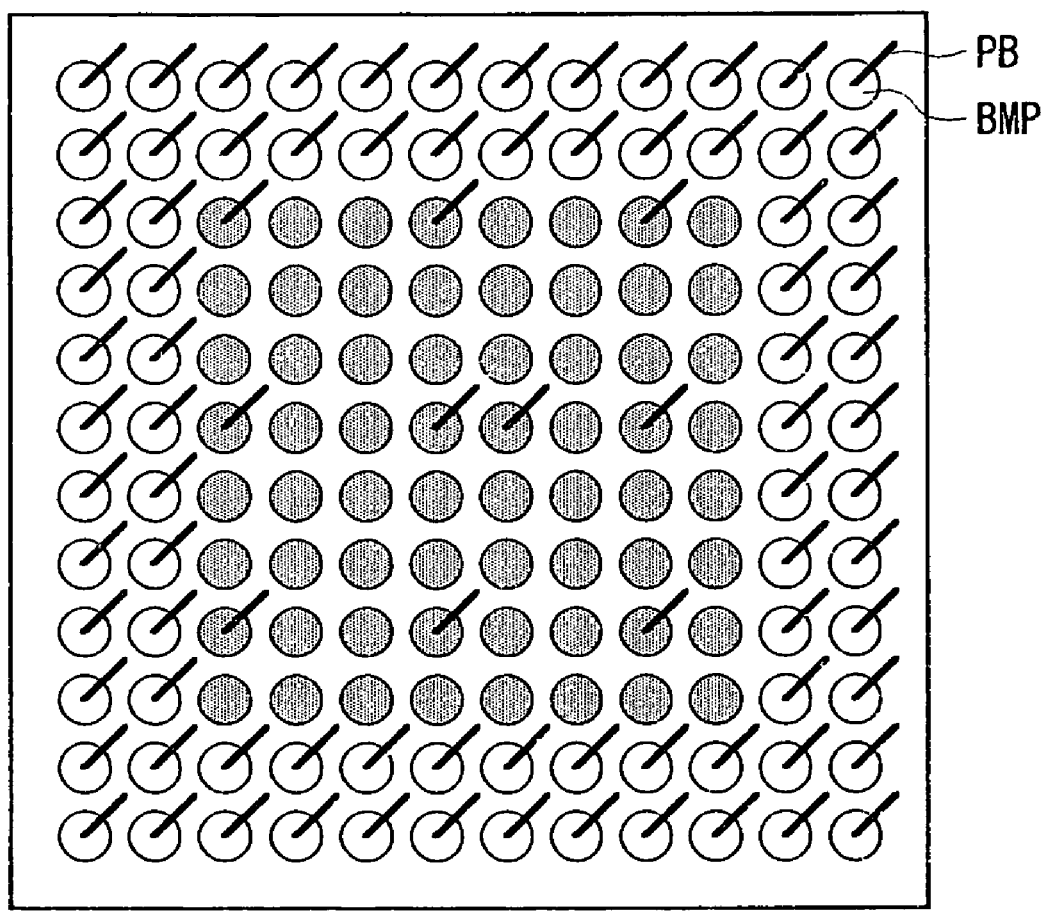
FIG. 4 is an explanatory view showing a wafer test method in the first embodiment.

FIG. 4 shows a wafer test method in the first embodiment. As shown in FIG. 4, with respect to the same semiconductor integrated circuit having the flip chip structure as in FIG. 1B, the test is performed while bringing power supply test terminals PB of a bump contact test jig into contact with only power bumps BMP which are decided as the power supply ports for use in the test by the power supply port decision processing, so that a possibility that the test cannot be performed due to a voltage drop can be eliminated, and besides the number of the power supply test terminals PB of the test jig can be reduced as compared with a conventional wafer test method (FIG. 1B). This makes it possible to certainly perform the test of the semiconductor integrated circuit having the flip chip structure and reduce the test cost of the semiconductor integrated circuit having the flip chip structure. Especially when the chip size is large and the number of power bumps is very large, the present invention produces a substantial effect.

Figure 5:
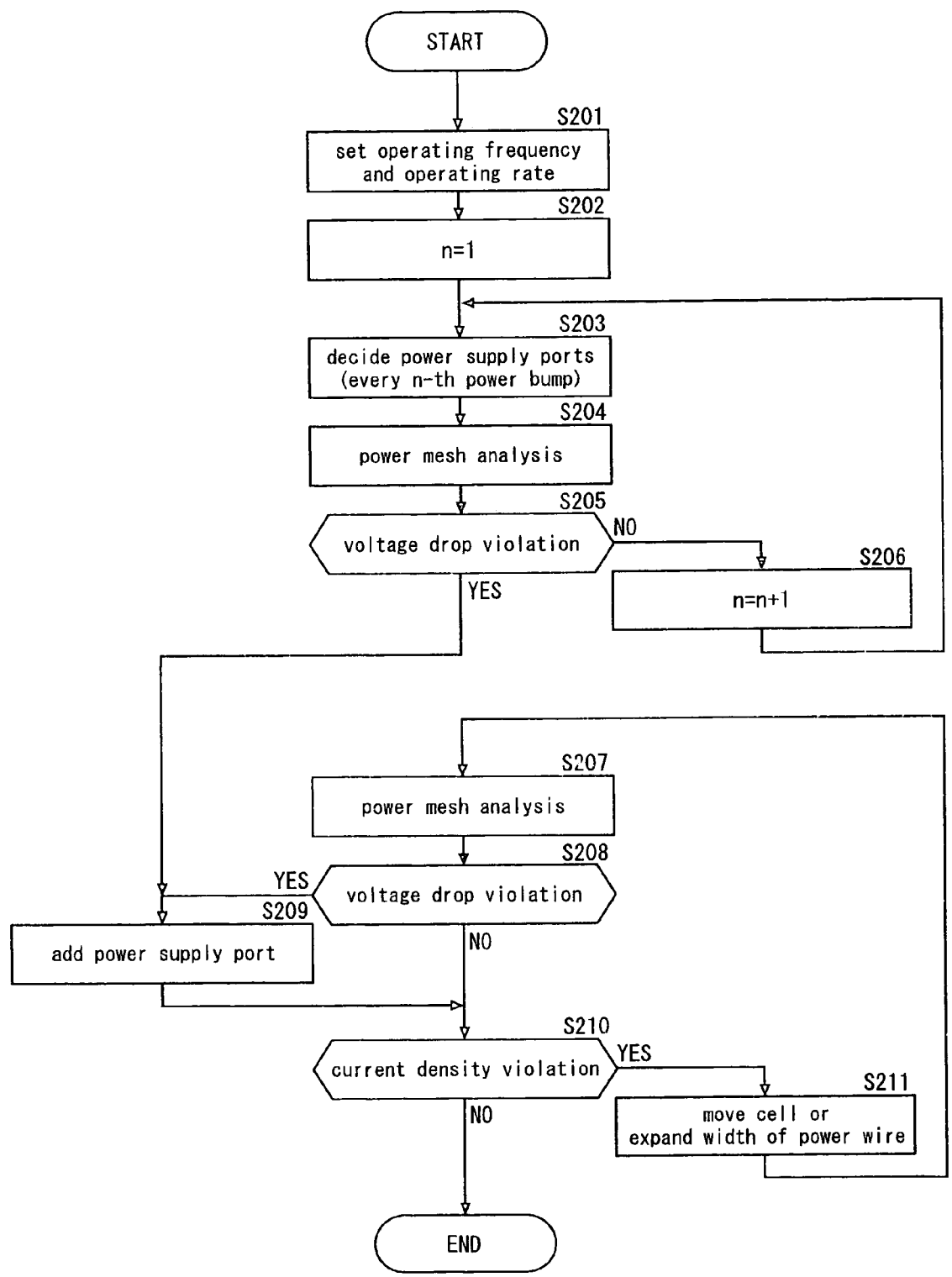
FIG. 5 is a flowchart showing a second embodiment of the present invention.

FIG. 5 shows a second embodiment of the present invention. The second embodiment is the same as the first embodiment except that the power supply port decision processing by the CAD system 100 is different. In the second embodiment, the CAD system 100 (the CPU 101) decides the power supply ports for use in the test with respect to the semiconductor integrated circuit having the flip chip structure by appropriately performing steps S201 to S211 shown below.

In step S201, the CAD system 100 sets an operating frequency and an operating rate in a wafer test. After this, the power supply port decision processing proceeds to step s202.

In step S202, the CAD system 100 sets the value of a variable n to 1. After this, the power supply port decision processing proceeds to step S203.

In step S203, the CAD system 100 decides every n-th power bump out of plural power bumps as the power supply port for use in the test. After this, the power supply port decision processing proceeds to step S204.

In step S204, the CAD system 100 performs a power mesh analysis at the operating frequency and the operating rate set in step S201 by the power mesh analysis unit 205. After this, the power supply port decision processing proceeds to step S205.

In step S205, the CAD system 100 determines whether or not a voltage drop violation is detected by the power mesh analysis performed in step S204. If it is determined that the voltage drop violation is detected by the power mesh analysis, the power supply port decision processing proceeds to step S209. If it is determined that the voltage drop violation is not detected by the power mesh analysis, the power supply port decision processing proceeds to step S206.

In step S206, the CAD system 100 increases the value of the variable n by one. After this, the power supply port decision processing proceeds to step S203. Accordingly, steps S203 to S206 are repeatedly performed until the voltage drop violation is detected by the power mesh analysis performed in step S204. Therefore, when the voltage drop violation is detected by the power mesh analysis performed in step S204, the number of power supply ports at this time is less than the required minimum number of the power supply ports for use in the test.

In step S207, the CAD system 100 performs a power mesh analysis at the operating frequency and the operating rate set in step S201 by the power mesh analysis unit 205. After this, the power supply port decision processing proceeds to step S208.

In step S208, the CAD system 100 determines whether or not a voltage drop violation is detected by the power mesh analysis performed in step S207. If it is determined that the voltage drop violation is detected by the power mesh analysis, the power supply port decision processing proceeds to step S209. If it is determined that the voltage drop violation is not detected by the power mesh analysis, the power supply port decision processing proceeds to step S210.

In step S209, the CAD system 100 adds a power bump in the vicinity of a place where the voltage drop violation occurs as the power supply port for use in the test. After this, the power supply port decision processing proceeds to step S210.

In step S210, the CAD system 100 determines whether or not a current density violation is detected by the power mesh analysis performed in step S207. If it is determined that the current density violation is detected by the power mesh analysis, the power supply port decision processing proceeds to step S211. If it is determined that the current density violation is not detected by the power mesh analysis, the power supply port decision processing is completed.

In step S211, the CAD system 100 moves a cell in a place where the current density violation occurs to connect it to a thick power wire or expands the width of a power wire in the place where the current density violation occurs by the layout design unit 203. After this, the power supply port decision processing proceeds to step S207. Accordingly, steps S207 to S211 are repeatedly performed until neither the voltage drop violation nor the current density violation is detected by the power mesh analysis performed in step S207.

The above-described second embodiment is the same as the first embodiment in that optimization is performed by adjusting the number of power supply ports although their starting points are different. Hence, even in the second embodiment, the same effect as in the first embodiment can be obtained.

The invention is not limited to the above embodiments and various modifications may be made without departing from the spirit and scope of the invention. Any improvement may be made in part or all of the components.

What is claimed is:

1. A method for supplying a power to a semiconductor integrated circuit in a test comprising:
    preparing the semiconductor integrated circuit having a flip chip structure in the test,
    finding, by using a computer, a required minimum number of power supply ports for use in the test based on power consumption information and deciding the required minimum number of power bumps out of a plurality of power bumps as the power supply ports for use in the test;
    wherein among the plural power bumps located on a chip of the semiconductor integrated circuit, one or more of the plural power bumps being determined as the power supply ports for use in the test are brought into contact with power supply test terminals of a test jig, and the remaining power bumps are not brought into contact with the power supply test terminals of the test jig during the test, and
    repeating a step of detecting a voltage drop violation and a current density violation until neither violation is detected, using a power mesh analysis
    wherein the step comprises:
    deciding as the power supply ports for use in the test, a power bump corresponding to a place where the voltage drop violation occurs when the voltage drop violation is detected by the power mesh analysis and
    modifying a layout of a place where the current density violation occurs when the current density violation is detected by the power mesh analysis.

2. The power supply method according to claim 1, further comprising
    calculating a power consumption of the semiconductor integrated circuit using a predetermined test pattern to generate said power consumption information.

3. The power supply method according to claim 2, wherein
    said predetermined test pattern is a test pattern, out of a plurality of test patterns for use in the test, in which the power consumption of the semiconductor integrated circuit becomes maximum.

4. A method for supplying a power to a semiconductor integrated circuit in a test, comprising:
    preparing the semiconductor integrated circuit having a flip chip structure in the test,
    repeating, by using a computer, processing of deciding a first one in every predetermined number of power bumps out of plural power bumps as power supply ports for use in the test while increasing said predetermined number sequentially, until a voltage drop violation is detected by a power mesh analysis,
    wherein among the plural power bumps located on a chip of the semiconductor integrated circuit, one or more of the plural power bumps being determined as the power supply ports for use in the test are brought into contact with power supply test terminals of a test jig, and the remaining power bumps are not brought into contact with the power supply test terminals of the test jig during the test, and repeating a step of detecting a voltage drop violation and a current density violation until neither violation is detected, using a power mesh analysis, wherein the step comprising:

deciding as the power supply ports for use in the test, a power bump corresponding to a place where the voltage drop violation occurs when the voltage drop violation is detected by the power mesh analysis and modifying a layout of a place where the current density violation occurs when the current density violation is detected by the power mesh analysis.

5. A computer aided design (CAD), system for a semiconductor integrated circuit having a flip chip structure, the CAD system performing:

preparing the semiconductor integrated circuit having a flip chip structure in the test, finding a required minimum number of power supply ports for use in a test based on power consumption information and deciding the required minimum number of power bumps out of plural power bumps as the power supply ports for use in the test, wherein among the plural power bumps located on a chip of the semiconductor integrated circuit, one or more of the plural power bumps being determined as the power supply ports for use in the test are brought into contact with power supply test terminals of a test jig, and the remaining power bumps are not brought into contact with the power supply test terminals of the test jig during the test, and repeating a step of detecting a voltage drop violation and a current density violation until neither violation is detected, using a power mesh analysis, wherein the step comprising:

deciding as the power supply ports for use in the test, a power bump corresponding to a place where the voltage drop violation occurs when the voltage drop violation is detected by the power mesh analysis and modifying a layout of a place where the current density violation occurs when the current density violation is detected by the power mesh analysis.

6. The CAD system according to claim 5, further performing: calculating a power consumption of the semiconductor integrated circuit using a predetermined test pattern to generate the power consumption information.

7. The CAD system according to claim 6, wherein
said predetermined test pattern is a test pattern, out of plural test patterns for use in the test, in which the power consumption of the semiconductor integrated circuit becomes maximum.

8. A computer aided design (CAD), system for a semiconductor integrated circuit having a flip chip structure, the CAD system performing:

preparing the semiconductor integrated circuit having a flip chip structure in the test, repeating processing of deciding a first one in every predetermined number of power bumps out of plural power bumps as power supply ports for use in a test while increasing said predetermined number sequentially, until a voltage drop violation is detected by a power mesh analysis, wherein among the plural power bumps located on a chip of the semiconductor integrated circuit, one or more of the plural power bumps being determined as the power supply ports for use in the test are brought into contact with power supply test terminals of a test jig, and the remaining power bumps are not brought into contact with the power supply test terminals of the test jig during the test, and repeating a step of detecting a voltage drop violation and a current density violation until neither violation is detected, using a power mesh analysis, wherein the step comprising:

deciding as the power supply ports for use in the test, a power bump corresponding to a place where the voltage drop violation occurs when the voltage drop violation is detected by the power mesh analysis and modifying a layout of a place where the current density violation occurs when the current density violation is detected by the power mesh analysis.

\* \* \* \* \*